United States Patent
Kim et al.

(10) Patent No.: US 7,851,993 B2
(45) Date of Patent: Dec. 14, 2010

(54) ORGANIC ELECTRO-LUMINESCENCE DISPLAY DEVICE

(75) Inventors: Young Mi Kim, Incheon (KR); Ho Jin Kim, Gyeonggi-do (KR); Moon Ky Yee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 12/314,776

(22) Filed: Dec. 16, 2008

(65) Prior Publication Data

US 2009/0174318 A1 Jul. 9, 2009

(30) Foreign Application Priority Data

Dec. 24, 2007 (KR) ...................... 10-2007-0136145

(51) Int. Cl.
*H01J 1/62* (2006.01)
(52) U.S. Cl. ........................ 313/504; 313/506; 313/512
(58) Field of Classification Search ................. 313/504, 313/506, 512
See application file for complete search history.

(56) References Cited

U.S. PATENT DOCUMENTS 7,224,116 B2 * 5/2007 Stegamat .................... 313/506
7,671,532 B2 * 3/2010 Kim ........................... 313/509

FOREIGN PATENT DOCUMENTS

CN 1653853 A 8/2005
WO WO 03/096751 A1 11/2003

* cited by examiner

*Primary Examiner*—Vip Patel
(74) *Attorney, Agent, or Firm*—Morgan Lewis & Bockius LLP

(57) ABSTRACT

An OLED device adapted to improve its life span and reliability is disclosed. The OLED device includes: a first electrode disposed on a substrate; an organic light emission layer disposed on the first electrode; a second electrode disposed on the organic light emission layer; an auxiliary electrode disposed on the second electrode; and a getter electrode, disposed on the auxiliary electrode, to remove at least one of moisture and oxygen.

12 Claims, 3 Drawing Sheets

ORGANIC ELECTRO-LUMINESCENCE DISPLAY DEVICE

CROSS-REFERENCE TO RELATED APPLICATION

This application claims priority under 35 U.S.C. 119 to Korean Patent Application No. 10-2007-0136145, filed on Dec. 24, 2007, which is hereby incorporated by reference in its entirety.

BACKGROUND

1. Field of the Disclosure

This disclosure relates to an organic electro-luminescence display device, and particularly to an organic electro-luminescence display device adapted to ensure its life span and reliability 2. Description of the Related Art Display devices have been developed along with the development of information communication and became a necessity of modern. Of the display devices, organic electro-luminescence display (OLED) devices can be light and slim since they do not need backlight units required for liquid crystal display devices. Also, the OLED devices can be manufactured through simple processes and can have price competitiveness. Moreover, the OLED devices have a low voltage drive, a high luminous efficiency, and a wide viewing angle. In view of these points, the OLED devices have caught more of the attention as one of next-generation display devices.

The OLED devices fundamentally include an organic light emission diode element consisting of an anode electrode, a cathode electrode, and an organic light emission layer interposed between the anode and cathode electrodes. The organic light emission diode element uses a luminous principle of recombining excitation leptons (or particles) such as free hole and electron. The recombination of the free hole and electron allows the hole and electron to transit from an instable status to a stable status, thus the hole and electron emit lights. In other words, the organic light emission diode element generates free holes in the anode electrode and free electrons in the cathode electrode so that the free holes and electrons from the anode and cathode electrodes are recombined with each other in the organic light emission layer, thereby emitting lights.

In the OLED device, since the organic light emission layer can be easily deteriorated by at least one of moisture and oxygen, defects such as black spots and dark pixels may appear. The black spots are caused by some pixels being not emitted at the display of an image, thereby showing a black color to users. Also, the dark pixel corresponds to the pixel which is not driven.

In order to solve these defects, the organic light emission diode element is sealed off with a seal substrate and an UV curing (or hardening) resin and is shielded from an external environment. The seal substrate and the UV curing resin do not substantially shield the organic light emission diode element from at least one of the external moisture and oxygen. Due to this, the organic light emission diode element is gradually deteriorated due to at least one of the intruded moisture and oxygen thereinto, along with time.

BRIEF SUMMARY

Accordingly, the present embodiments are directed to an OLED device that substantially obviates one or more of problems due to the limitations and disadvantages of the related art.

An object of the embodiment of the present disclosure is to provide an OLED device that removes at least one of the moisture and oxygen intruded from the external to ensure its reliability and to improve its life span.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an OLED device includes: a first electrode disposed on a substrate; an organic light emission layer disposed on the first electrode; a second electrode disposed on the organic light emission layer; an auxiliary electrode disposed on the second electrode; and a getter electrode, disposed on the auxiliary electrode, to remove at least one of moisture and oxygen.

The OLED device further includes: a separator, interposed between the first substrate and the second electrode around each pixel, to separate the second electrode by pixels; a protrusion member, disposed on the first electrode within each pixel, to partially protrude the second electrode, the auxiliary electrode, and the getter electrode; and a drive element, disposed on a second substrate opposite to the first substrate, to electrically contact a protruded part of the getter electrode by the protrusion member.

An OLED device according to another aspect of the present embodiment includes: a first electrode disposed on a substrate; an organic light emission layer disposed on the first electrode; a second electrode disposed on the organic light emission layer; and a conductive getter electrode, disposed on the second electrode, to remove at least one of moisture and oxygen The getter electrode is formed from a getter material removing at least one of the moisture and the oxygen.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
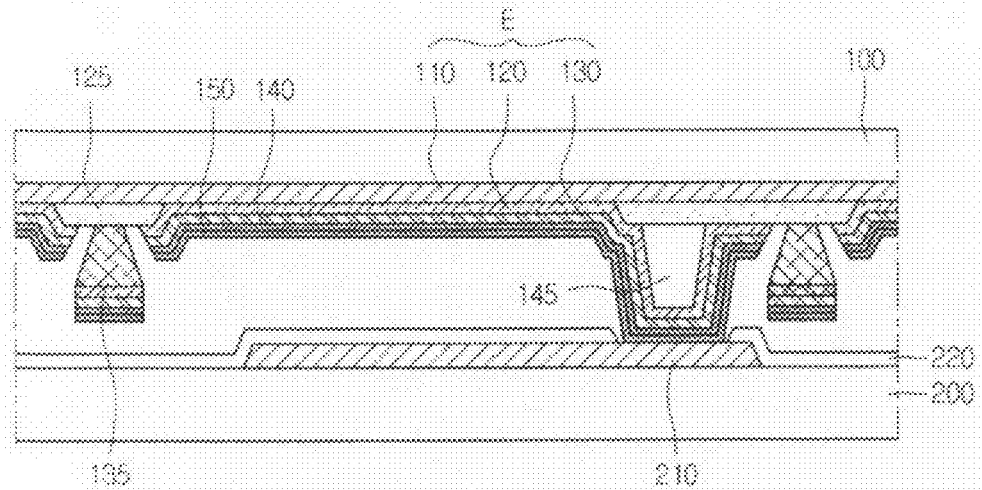
FIG. 1 is an enlarged cross sectional view showing a pixel in an OLED device according to a first embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a cross sectional view explaining an OLED device according to an embodiment of the present disclosure. The OLED device according to this embodiment includes a plurality of pixels for displaying an image, but only one of the plural pixels has been expansively shown in FIG. 1, for convenience of explanation.

Referring to FIG. 1, the OLED device according to this embodiment includes an organic light emission diode element E and a drive element 210 each disposed on first and second substrates 100 and 200. The first and second substrates 100 and 200 are bound each other with a seal member (not shown) in order to connect the organic light emission diode element E with the drive element 210.

The first substrate 100 may be of a transparent material through which passes lights therethrough. For example, the first substrate 100 includes one of a glass substrate, a plastic substrate, and so on.

The organic light emission diode element E emits lights for displaying an image (that is, a picture). To this end, the organic light emission diode element E includes a first electrode 110, an organic light emission layer 120, and a second electrode 130 which are sequentially stacked on the first substrate 100.

Actually, the first substrate 100 is defined into a plurality of pixels. Each pixel may be a minimal unit composing one image or picture. Hereby, the organic light emission diode element E will be provided as one pixel.

The first electrode 110 is disposed on the first substrate 110 and is commonly used for the plural pixels. Also, the first electrode 110 can be formed from a transparent conduction material. For example, the first electrode 110 may be formed of one of ITO (Indium-Tin-Oxide) and IZO (Indium-Zinc-Oxide). Such a first electrode 110 applies first electric charges to the organic light emission layer 120 which will be described below.

On the first electrode 110, a buffer pattern 125 is disposed to expose each pixel. In other words, the buffer pattern 125 is extended along the edges of each pixel so that the pixels are defined. The buffer pattern 125 may include an insulation material. For example, the buffer pattern 125 can be formed from one of silicon oxide and silicon nitride.

A separator 135 is disposed on the buffer pattern 125 around each pixel. The separator 135 has a function of separating the second electrode 130, which is described below, by pixels. To this end, the separator 135 can be extended along the edges of each pixel, in such a manner to have a cross section of inversed trapezoid shape.

A protruded member 145 from the buffer pattern 125 is provided. The protrusion member 145 is disposed on the buffer pattern 125 within each pixel which is defined by the separator 135. Such a protrusion member 145 performs a function of electrically connecting the second electrode 130 with a drive element 210 which will be described below. Alternatively, the protrusion member 145 can have a cross section of non-inversed trapezoid shape, in order to prevent the disconnection of the second electrode 130 with the drive element 210.

The organic light emission layer 120 is disposed on the first electrode 110. More specifically, the organic light emission layer 120 may be positioned at an exposed region of the first electrode 110 which is exposed after dispose the buffer pattern 125. In accordance therewith, the organic light emission layer 120 can be partially covered with the protrusion member 145. Such an organic light emission layer 120 generates lights by recombining the first electric charges from the first electrode 110 with second electric charges from the second electrode 130.

The second electrode 130 disposed on the organic light emission layer 120 can be separated by the separator 135 in each pixel. Hereby, the second electrode 130 can cover the protrusion member 145 and furthermore can be partially protruded by the protrusion member 145. Also, the second electrode 130 may be separated, in each pixel, by the separator 135 having the cross section of inversed trapezoid shape.

Additionally, first charge injection and transfer layers can be interposed between the first electrode 110 and the organic light emission layer 120. Second charge injection and transfer layers also can be interposed between the organic light emission layer 120 and the second electrode 130.

The second electrode 130 applies second charges, which may be electrons, to the organic light emission layer 120. Also, the second electrode 130 may be of a conduction material which has a lower work function than that of the first electrode 110. Furthermore, the conduction material forming the second electrode 130 has a superior light reflectance in order to reflect lights, which are emitted in the organic light emission layer 120, toward the first electrode 110. For example, the second electrode 130 may be one of Ag, Cu, Au, Al, Li, Ca, Ba, and Hg. Alternatively, the second electrode 130 may be a double film or an alloy, which include metals selected from the group of the Ag, Cu, Au, Al, Li, Ca, Ba, and Hg. In other words, the second electrode 130 can be one of a double film of Li and Al, a double of Ca and Al, a double of Ba and Al, an alloy of Mg and Al, and an alloy of Li and Al.

In such an organic light emission diode element E, since the second electrode 130 is formed from the light reflection material, the lights generated in the organic light emission layer 120 are emitted all through the first substrate 100 so that an image is provided to an user. The emission of all the lights through the first substrate 100 can prevent a decrement of aperture ratio due to the drive element 210, in the OLED device of the first embodiment. Accordingly, the drive element 210 can be freely designed without considering the aperture ratio.

In this manner, the organic light emission diode elements E, which are separated by pixels and can be independently driven, are arranged on the first substrate 100.

On the other hand, the drive element 210 disposed on the second substrate 200 includes a switch thin film transistor selecting each of the pixels; a drive thin film transistor responsive to a passing electric signal, for example, a data signal, through the switch thin film transistor and enabling the organic light emission diode element E to emit lights; a capacitor maintaining the electric signal during a fixed period; and so on. This drive element 210 electrically contacts a part of the second electrode 130 which is protruded by means of the protrusion member 145, thereby being electrically connected to the organic light emission diode element E. In accordance therewith, the organic light emission diode element E can be driven by the electric signal from the drive element 210.

The organic light emission layer 120 can be easily deteriorated by moisture or oxygen and furthermore can shorten the life span of the OLED device. Due to this, a getter electrode 150 removing the moisture and/or oxygen further is disposed on the second electrode 130. The getter electrode 150 may be of a material removable at least one of the moisture and oxygen. More specifically, the getter electrode 150 can be formed from the conduction material. For example, the getter electrode 150 may be formed from Ca or Ba. Persons skilled in this art would know that the getter electrode 150 is not limited to be Ca or Ba, Only if the getter electrode could remove the moisture and/or oxygen, it could be adopted. Such a getter electrode 150 is protruded by the protrusion member 145 toward the second substrate 200 and is electrically connected to the drive element 210. In other words, the getter electrode 150 electrically connects the organic light emission diode element E with the drive element 210.

However, the getter electrode 150 must be oxidized while the moisture and/or oxygen are removed. This oxidation of the getter electrode 150 increases an electrical contact resistance between the organic light emission diode element E and the drive element 210, thereby may cause an electrical contact defect therebetween. Due to this, the OLED device causes picture defects, such a black spot, a dark pixel and so on, to occur so that its reliability can be deteriorated. This deterioration of reliability of the OLED device is accelerated in case the oxidation in the getter electrode 150 is spread to the second electrode 130.

Preferably, to address this disadvantage, an auxiliary electrode 140 is further interposed between the second electrode 130 and the getter electrode 150. The auxiliary electrode 140 may be of a conduction material having a lower oxidizing power than the one of the second electrode 130. For example, the auxiliary electrode 140 can include one of Au, Cu, Ag, and Hg. However, persons skilled in this would know that the auxiliary electrode 140 does not limited to be Au, Cu, Ag, and Hg, only if the auxiliary electrode 140 has a lower oxidizing power than the second electrode 130, it could be adopted.

Such an auxiliary electrode 140 preventing the oxidation of the second electrode 130 supplements an electric conductivity characteristic deteriorated by the oxidation of the getter electrode 150, thereby providing a characteristically stable electric-contact between the organic light emission diode element E and the drive element 210. And it is the similar case as to other embodiments.

In this way, the OLED device may include the second electrode 130 applying the second charges, the auxiliary electrode 140 preventing the oxidation of the second electrode 130 and providing the characteristically stable electric-contact between the organic light emission diode element E and the drive element 210. Therefore, the OLED device according to the first embodiment of the present disclosure can improve its life span and reliability.

The above OLED device according to the first embodiment of the present disclosure is explained as an OLED device of dual panel type in which the organic light emission diode element E and the drive element 210 are disposed substrates different from each other, but is not limited this. In other words, the auxiliary electrode 140 and the getter electrode 150 can be applied to an OLED device of single panel type where the organic light emission diode element E and the drive element 210 are disposed on one substrate. A reference number "220" in FIG. 1, which is not cited in the above description, indicates a protection film (or a passivation layer) protecting the drive element 210.

Figure 2:
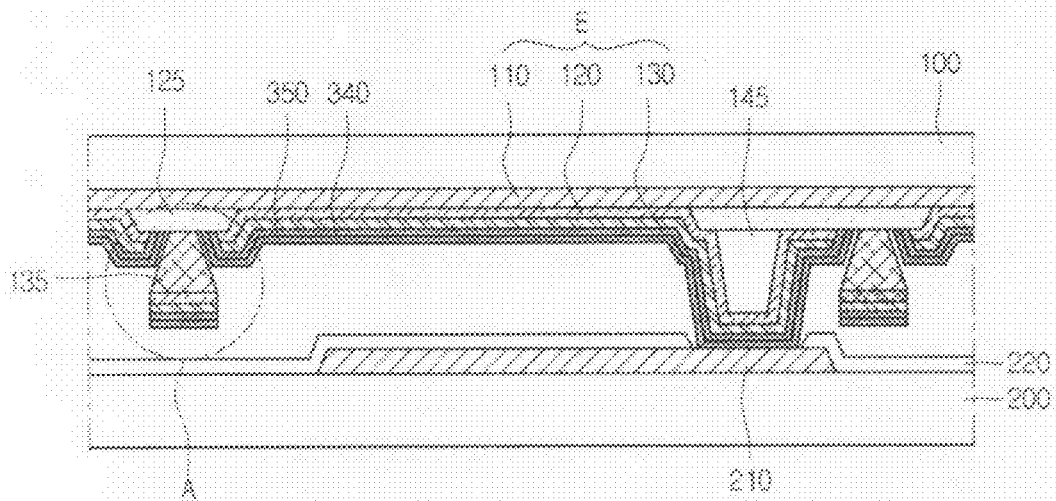
FIG. 2 is an enlarged cross sectional view showing one pixel in an OLED device according to a second embodiment of the present disclosure.
Figure 3:
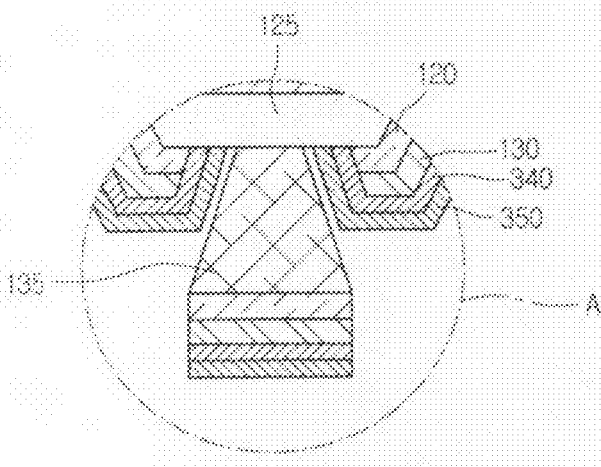
FIG. 3 is a partially enlarged view of an A-portion in FIG. 2.

FIGS. 2 and 3 are views explaining an OLED device according to a second embodiment of the present disclosure. FIG. 2 is an enlarged view showing one pixel in an OLED device according to the second embodiment of the present disclosure. FIG. 3 is an enlarged view showing the A-portion in FIG. 2. The OLED device according to the second embodiment has the same structure as that of the first embodiment described above, with the exception of an auxiliary electrode. Accordingly, the description of the first embodiment to be repeated in the second embodiment of the present disclosure will be omitted. Also, the OLED device according to the second embodiment of the present disclosure will refer to the same reference numbers for the same elements as that according to the first embodiment.

Referring to FIGS. 2 and 3, the OLED device according to the second embodiment of the present disclosure includes: a first electrode 110 disposed on a first substrate 100; a separator 135 disposed on the first electrode 110 around each pixel (in detail, boundary regions between the pixels); a protrusion member 145 disposed on the first electrode 110 within each pixel; an organic light emission layer 120 disposed on the first electrode 110; a second electrode 130 partially protruded by the protrusion member 145; an auxiliary electrode 340 disposed on the second electrode 130; and a getter electrode 350 disposed on the auxiliary electrode 340. The OLED device according to the second embodiment further includes a drive element 210 which is disposed on a second substrate 200 opposite the first substrate 100 and is electrically connected to the second electrode 130.

The auxiliary electrode 340 may be of a conduction material having a lower oxidizing power than that of the second electrode 130, in order to delay the oxidation of the second electrode 130 and characteristically improve an electric contact between the organic light emission diode element E and the drive element 210.

In case the auxiliary electrode 340 covers only the upper surface of the second electrode 130, the upper surface of the second electrode 130 can be protected from the oxidation, but the sides of the second electrode 130 which are exposed through the auxiliary electrode 340 can easily oxidize. In view of this point, the auxiliary electrode may be in a large square measure related to the second electrode 130. In other words, the auxiliary electrode 340 covers the upper surface and the sides of the second electrode 130 as well. Such an auxiliary electrode 340 can prevent the oxidation in the side of the second electrode, as well. As a result, the OLED device according to the second embodiment of the present disclosure can efficiently and substantially prevent the oxidation of the second electrode since it includes the auxiliary electrode 340 covering the upper surface and the sides of the second electrode 130.

Moreover, the getter electrode 35 can cover both the upper surface and the sides of the auxiliary electrode 340. Hereby, the second electrode 130 can be protected from the intrusion of moisture and/or oxygen through its sides, as well. As a result, the OLED device according to the second embodiment of the present disclosure can improve its life span and reliability.

Figure 4:
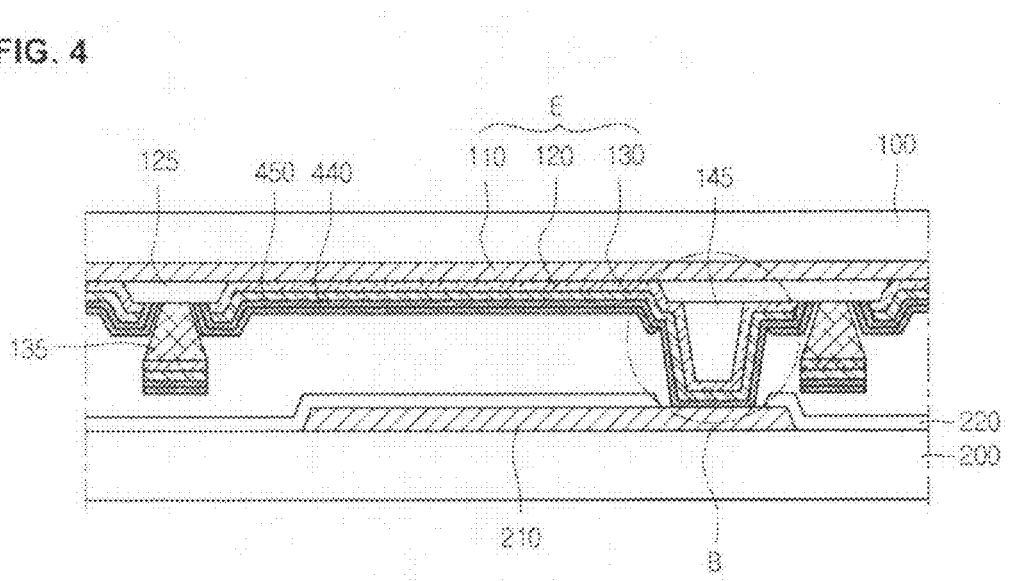
FIG. 4 is an enlarged cross sectional view showing one pixel in an OLED device according to a third embodiment of the present disclosure.
Figure 5:
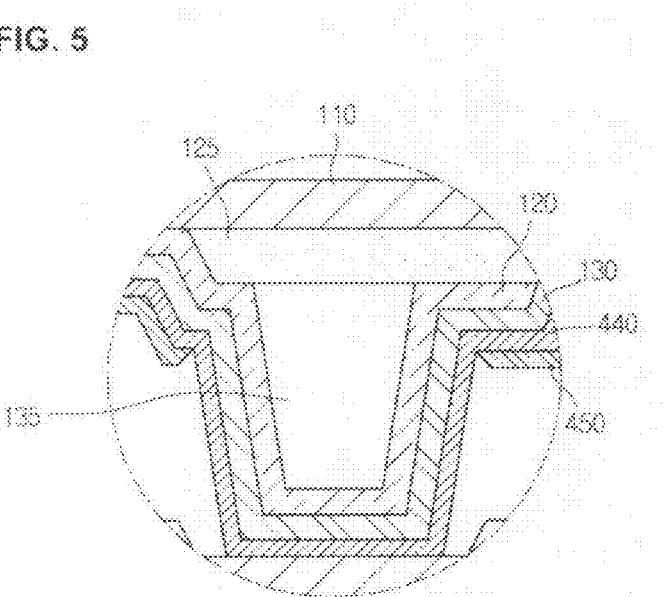
FIG. 5 is a partially enlarged view showing a B-portion in FIG. 4.

FIGS. 4 and 5 are views explaining an OLED device according to a third embodiment of the present disclosure. FIG. 4 is an enlarged view showing one pixel in the OLED device according to the third embodiment of the present disclosure. FIG. 5 is an enlarged view showing the B-portion in FIG. 4. The OLED device according to the third embodiment has the same structure as the one of the second embodiment described above, with the exception of a getter electrode. Accordingly, the description of the second embodiment to be repeated in the third embodiment of the present disclosure will be omitted. Also, the OLED device according to the third embodiment of the present disclosure will refer to the same reference numbers for the same elements as that according to the second embodiment.

Referring to FIGS. 4 and 5, the OLED device according to the third embodiment of the present disclosure includes a first electrode 110, a separator, 135, a protrusion member 145, an organic light emission layer 120, a second electrode 130, an auxiliary electrode 440 and a getter electrode 450, which are disposed on a first substrate 100. This OLED device further includes a drive element 210 which is disposed on a second substrate 200 opposite the first substrate 100 and is electrically connected to the second electrode 130.

The getter electrode 450 removes moisture and oxygen remained in the OLED device so that the life span and reliability of the OLED device are improved. Also, the a getter electrode 450 is partially protruded by means of the protrusion member 145 and contacts the drive element 210, thereby connecting the drive element 210 and the organic light emission diode element E with each other. Such a getter electrode 450 must be oxidized for the removal of the moisture and/or oxygen. The oxidation of the getter electrode 450 can increase an electric contact resistance between the drive element 210 and the organic light emission diode element E.

To address this disadvantage, the getter electrode 450 can form an opening in its region contacting the drive element 210, that is, its protruded region by the protrusion member 145. Through the opening of the getter electrode 450, a part of the auxiliary electrode 440 opposed to the protrusion member 145 is exposed. In other words, the auxiliary electrode 440 is partially exposed through the opening of the getter electrode 450 as well as is partially protruded by means of the protrusion member 145. In accordance therewith, the exposed and protruded part of the auxiliary electrode 440 electrically contacts the drive element 210 and electrically connects the drive element 210 and the organic light emission diode element E each other.

In this manner, as the drive element 210 and the organic light emission diode element E are connected with each other through the auxiliary electrode 440, the OLED device according to the third embodiment of the present disclosure can prevent the contact stability of the drive element 210 and organic light emission diode element E from deteriorating due to the oxidation of the getter electrode 450.

Figure 6:
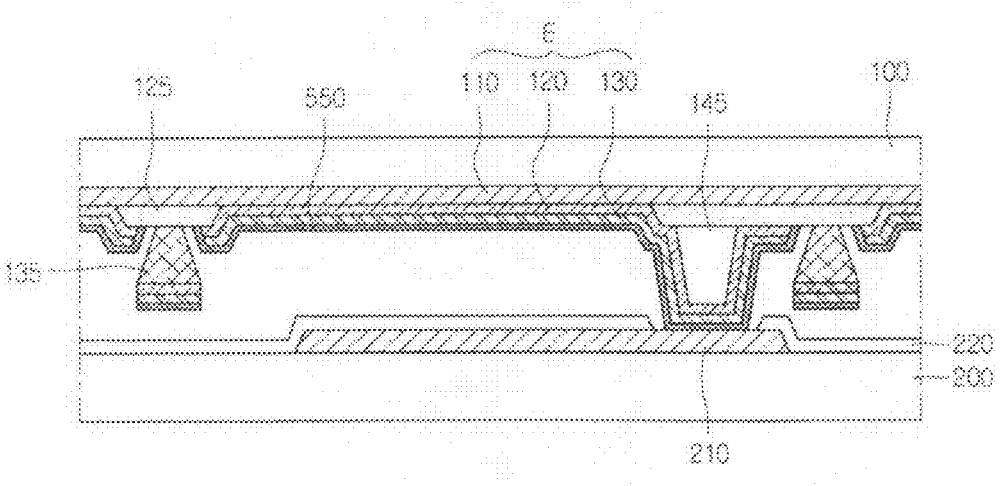
FIG. 6 is an enlarged cross sectional view showing a pixel in an OLED device according to a fourth embodiment of the present disclosure.

FIG. 6 is a view explaining an OLED device according to a fourth embodiment of the present disclosure. FIG. 4 is an enlarged cross sectional view showing one pixel in the OLED device according to the fourth embodiment of the present disclosure. The OLED device according to the fourth embodiment has the same structure as that of the second embodiment described above, with the exception of a getter electrode. Accordingly, the description of the second embodiment to be repeated in the fourth embodiment of the present disclosure will be omitted. Also, the OLED device according to the fourth embodiment of the present disclosure will refer to the same reference numbers for the same elements as that according to the second embodiment.

As shown in FIG. 6, the OLED device according to the fourth embodiment of the present disclosure includes a first electrode 110, a separator 135, a protrusion member 145, an organic light emission layer 120, a second electrode 130, and a getter electrode 550, which are disposed on a first substrate 100. This OLED device further includes a drive element 210 which is disposed on a second substrate 200 opposite the first substrate 100 and is electrically connected to the second electrode 130.

The getter electrode 550 is partially protruded by means of the protrusion member 145 and contacts the drive element 210, thereby connecting the drive element 210 and the organic light emission diode element E with each other. Also, the getter electrode 550 removes moisture and oxygen remained in the OLED device so that the life span and reliability of the OLED device are improved. To this end, the getter electrode 550 may include a getter material removing at least one of moisture and oxygen. Actually, the getter electrode 550 can be formed from one of Ca and Ba.

However, the getter electrode 550 must be oxidized for the removal of the moisture and/or oxygen and be deteriorated in its conduction characteristic. Due to this, an electric contact between the drive element 210 and the organic light emission diode element E is characteristically lowered so that the life span and reliability of the OLED device are deteriorated.

In order to maintain the conduction characteristic in case of oxidizing, the getter electrode 550 can be formed of a getter material and a conduction material. This conduction material may have a lower oxidizing power than those of the second electrode 130 and the getter material. For example, the conduction material can include at least one selected from a group which consists of Ag, Cu, Au, and Hg. Also, the getter electrode 550 may be formed through a process of vacuum-depositing the getter material and the conduction material. Of course, persons skilled in this art would know that the conduction material is not limited to be selected from these materials, only if it has a lower oxidizing power than those of the second electrode 130 and the getter material, it could be adopted. Such getter electrode 550 can have a stable conduction characteristic in spite of its oxidation. Accordingly, the getter electrode 550 can prevent the characteristic deterioration of the electric contact between the organic light emission diode element E and the drive element 210.

In this manner, the OLED device, according to the fourth embodiment of the present disclosure, includes the getter electrode 550 consisting of getter and conduction materials, thereby maintaining a stable conduction characteristic between the drive element E and the organic light emission diode element E. Therefore, this OLED device can improve its life span and reliability without adding additional manufacturing processes.

Moreover, an auxiliary electrode, not shown in FIG. 6, can be further interposed between the second electrode 130 and the getter electrode 550. The auxiliary electrode may have a lower oxidation power than those of the second electrode 130 and the getter electrode 550.

The luminous characteristic of an OLED device according to the embodiment of the present disclosure is observed and described below.

Figure 7:
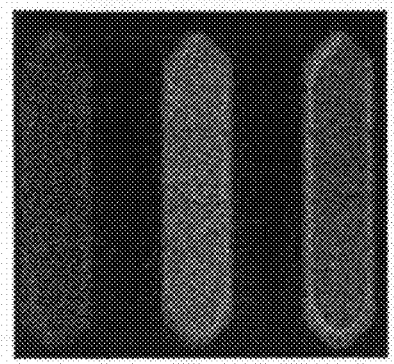
FIGS. 7 and 8 are photos showing a luminous characteristic of OLED device taken at a constant time after driving.
Figure 8:
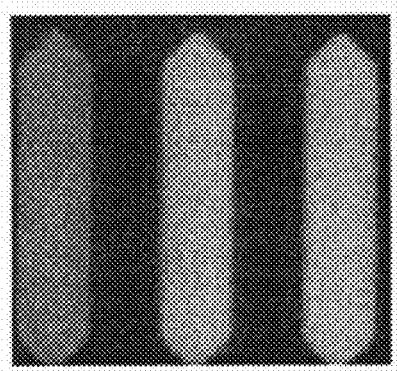

FIGS. 7 and 8 are photos showing the luminous states of the OLED devices and taken at time after which the OLED devices have been driven for a fixed period. FIG. 7 shows the luminous state of an OLED device having a second electrode which is formed of Al, and FIG. 8 shows the luminous state of another OLED device having a second electrode, an auxiliary electrode, and a getter electrode which are respectively formed of Al, Ag, and Ca.

As seen in FIGS. 7 and 8, it is evident that a narrowing (or contracting) phenomenon of the luminous areas is decreased for one OLED device, having a triple electrode structure of the second, auxiliary, and getter electrodes, in comparison with for the other OLED device having a single electrode structure of the second electrode. In other words, it is evident that the former OLED device having the triple electrode structure of the second, auxiliary, and getter electrodes ensures its life span and reliability.

Figure 9:
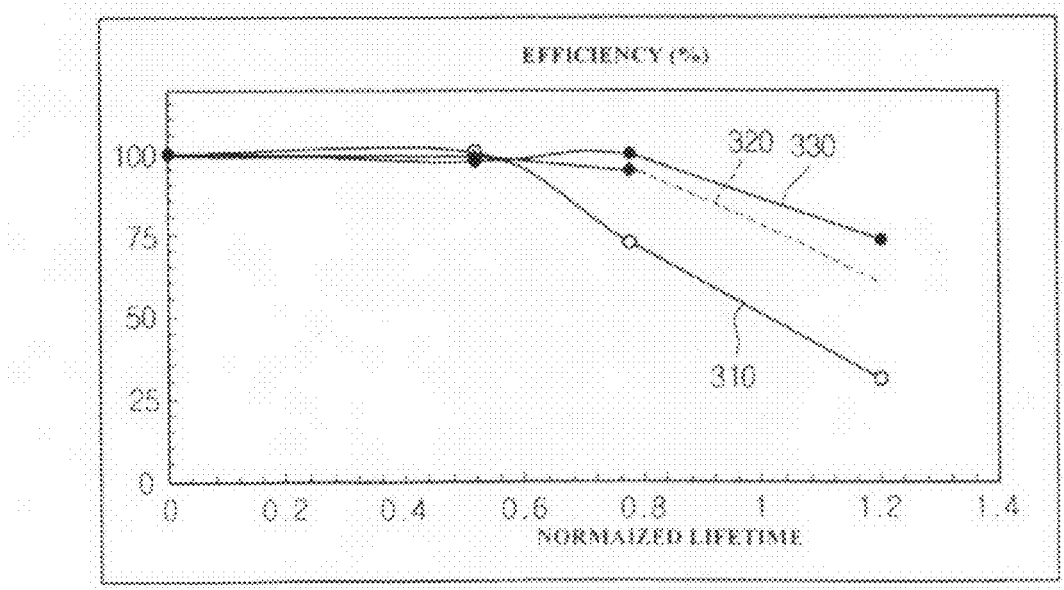
FIG. 9 is a graphic diagram showing a life span characteristic of OLED device.

FIG. 9 is a graphic diagram showing life span characteristics of OLED devices. In FIG. 9, an efficiency variation line 310 explains the life span characteristic for a first OLED device including only the second electrode, while the other efficiency variation lines 320 and 330 explain the life span characteristics for second and third OLED devices which have the second and getter electrodes. In the second and third OLED devices, the second electrode is formed from Al, and the getter electrode is formed through a process of vacuum-depositing Ca and Ag in a ratio of 1:1. In other words, the second and third OLED devices are the same samples having the second and getter electrodes which are formed of the same materials.

FIG. 9 evidently indicates that the second and third OLED devices have an improved life span about one and half times related to that of the first OLED device. Accordingly, it is evident that the life span is greatly improved in the second and third OLED devices having a double electrode structure, which includes the second electrode and the getter electrode of electric conduction materials, than in the first OLED device having only the second electrode.

As described above, the OLED devices, according to the embodiments of the present disclosure, prevent the deterioration of the organic light emission diode element, since they include the electrode of absorption and conduction characteristics. Moreover, these OLED devices include the electrode which is formed of a conduction material of less oxidizing power and another conduction material of absorption characteristic, thereby maintaining the stable electric contact between the drive element (in detail, thin film transistor) and the organic light emission diode element which are disposed on the respective substrates. As a result, these OLED devices can greatly improve their life span and reliability.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. An organic light emission display device comprising:
   a first electrode disposed on a substrate;
   an organic light emission layer disposed on the first electrode;
   a second electrode disposed on the organic light emission layer;
   an auxiliary electrode disposed on the second electrode; and
   a getter electrode which is formed of conduction material and for removing moisture and oxygen, disposed on the auxiliary electrode.

2. The organic light emission display device claimed as claim 1, further comprising:
   a buffer pattern, extended along the edges of each pixel;
   a separator, interposed between the buffer pattern and the second electrode around each pixel, to separate the second electrode by pixels;
   a protrusion member, disposed on the buffer pattern within each pixel, to partially protrude the second electrode, the auxiliary electrode, and the getter electrode; and
   a drive element, disposed on a second substrate opposite to the first substrate, to electrically contact a protruded part of the getter electrode by the protrusion member.

3. The organic light emission display device claimed as claim 1, wherein the getter electrode including an opening exposing the auxiliary electrode, the device further comprising:
   a buffer pattern, extended along the edges of each pixel;
   a separator, interposed between the buffer pattern and the second electrode around each pixel, to separate the second electrode by pixels;
   a protrusion member, disposed on the buffer pattern of each pixel, to protrude the exposed auxiliary electrode through the opening of the getter electrode; and
   a drive element electrically contacting the protruded auxiliary electrode by the protrusion member.

4. The organic light emission display device claimed as claim 1, wherein the auxiliary electrode covers the end surfaces of the second electrode.

5. The organic light emission display device claimed as claim 1, wherein the auxiliary electrode includes one selected from a group consisting of Ag, Cu, Au, and Hg.

6. The organic light emission display device claimed as claim 1, wherein the getter electrode includes one of Ca and Ba.

7. The organic light emission display device claimed as claim 1, wherein the second electrode is formed of at least one among Ag, Cu, Au, Li, Ca, Ba, Hg, a double film of Li/Al, a double film of Ca/Al, a double film of Ba/Al, an alloy of Mg and Al, and an alloy of Li and Al.

8. An organic light emission display device comprising:
   a first electrode disposed on a substrate;
   an organic light emission layer disposed on the first electrode;
   a second electrode disposed on the organic light emission layer; and
   a getter electrode which is formed of a getter material removing at least one of the moisture and/or the oxygen and a conduction material, disposed on the second electrode.

9. The organic light emission display device claimed as claim 8, further comprising:
   a buffer pattern, extended along the edges of each pixel;
   a separator, interposed between the buffer pattern and the second electrode around each pixel, to separate the second electrode by pixels;
   a protrusion member, disposed on the buffer pattern within each pixel, to partially protrude the second electrode and the getter electrode; and
   a drive element, disposed on a second substrate opposite the first substrate, to electrically contact a protruded part of the getter electrode by the protrusion member.

10. The organic light emission display device claimed as claim 8, further comprising an auxiliary electrode interposed between the second electrode and the getter electrode.

11. A method of manufacturing the organic light emission display device, comprising:
   forming a first electrode disposed on a substrate;
   forming an organic light emission layer disposed on the first electrode;
   forming a second electrode disposed on the organic light emission layer;
   forming an auxiliary electrode disposed on the second electrode; and
   forming a getter electrode on the auxiliary electrode.

12. The method of manufacturing the organic light emission display device according to claim 11, further comprising the step of
   forming a buffer pattern extended along the edges of each pixel;
   forming a separator between the buffer pattern and the second electrode around each pixel;
   forming a protrusion member on the buffer pattern within each pixel; and
   forming a drive element on a second substrate opposite the first substrate.

* * * * *